(12) United States Patent
Allen

(10) Patent No.: US 7,825,033 B2
(45) Date of Patent: Nov. 2, 2010

(54) METHODS OF FORMING VARIABLE RESISTANCE MEMORY CELLS, AND METHODS OF ETCHING GERMANIUM, ANTIMONY, AND TELLURIUM-COMPRISING MATERIALS

(75) Inventor: Tuman Earl Allen, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 66 days.

(21) Appl. No.: 11/450,020

(22) Filed: Jun. 9, 2006

(65) Prior Publication Data

US 2007/0287252 A1    Dec. 13, 2007

(51) Int. Cl.
H01L 21/302    (2006.01)

(52) U.S. Cl. .................... 438/710; 438/95; 438/711; 216/75

(58) Field of Classification Search ............... 438/257, 438/95, 48, 57, 93
See application file for complete search history.

(56) References Cited

U.S. PATENT DOCUMENTS

| | | | |
|---|---|---|---|
| 5,761,115 A | 6/1998 | Kozicki et al. | |
| 5,896,312 A | 4/1999 | Kozicki et al. | |
| 5,914,893 A | 6/1999 | Kozicki et al. | |
| 6,084,796 A | 7/2000 | Kozicki et al. | |
| 6,348,365 B1 | 2/2002 | Moore et al. | |
| 6,709,958 B2 | 3/2004 | Li et al. | |
| 6,730,547 B2 | 5/2004 | Li et al. | |
| 6,800,504 B2 | 10/2004 | Li et al. | |
| 6,831,019 B1 * | 12/2004 | Li et al. | 438/714 |
| 6,849,868 B2 | 2/2005 | Campbell | |
| 6,864,500 B2 | 3/2005 | Gilton | |
| 6,953,720 B2 | 10/2005 | Moore et al. | |
| 2004/0072446 A1 * | 4/2004 | Liu et al. | 438/719 |
| 2005/0040136 A1 * | 2/2005 | Lee et al. | 216/22 |
| 2005/0054207 A1 | 3/2005 | Li et al. | |
| 2005/0142863 A1 * | 6/2005 | Spandre | 438/640 |
| 2006/0011910 A1 | 1/2006 | Campbell | |
| 2006/0046444 A1 | 3/2006 | Campbell et al. | |
| 2006/0086931 A1 | 4/2006 | Klein | |
| 2006/0141696 A1 * | 6/2006 | Choi et al. | 438/238 |
| 2006/0278900 A1 * | 12/2006 | Chang et al. | 257/248 |
| 2007/0161186 A1 * | 7/2007 | Ho | 438/257 |
| 2007/0251918 A1 * | 11/2007 | Bera et al. | 216/58 |

OTHER PUBLICATIONS

Yoon et al., *Etching Characteristics of $Te_2Sb_2Te_5$ Using High-Censity Helicon Plasma for the Nonvolatile Phase-Change Memory Applications*, Jap. J. Appl. Phys., vol. 44, No. 27, pp. L869-L872 (2005).

* cited by examiner

Primary Examiner—Thanhha Pham
Assistant Examiner—Tony Tran
(74) Attorney, Agent, or Firm—Wells St. John P.S.

(57) ABSTRACT

A method of etching a material that includes comprising germanium, antimony, and tellurium encompasses exposing said material to a plasma-enhanced etching chemistry comprising $Cl_2$ and $CH_2F_2$. A method of forming a variable resistance memory cell includes forming a conductive inner electrode material over a substrate. A variable resistance chalcogenide material comprising germanium, antimony, and tellurium is formed over the conductive inner electrode material. A conductive outer electrode material is formed over the chalcogenide material. The germanium, antimony, and tellurium-comprising material is plasma etched using a chemistry comprising $Cl_2$ and $CH_2F_2$.

27 Claims, 4 Drawing Sheets

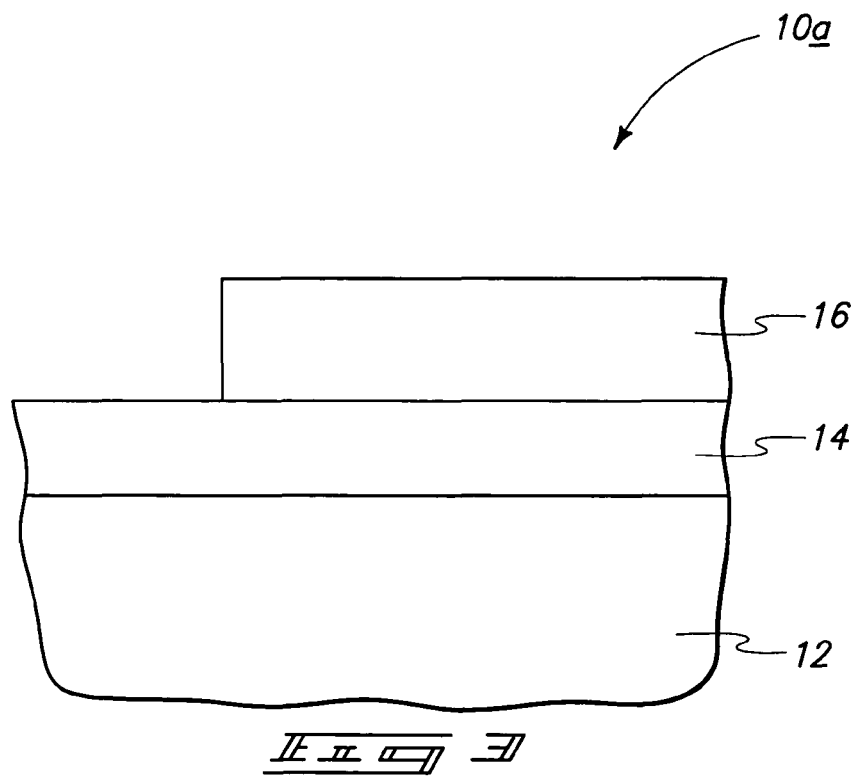
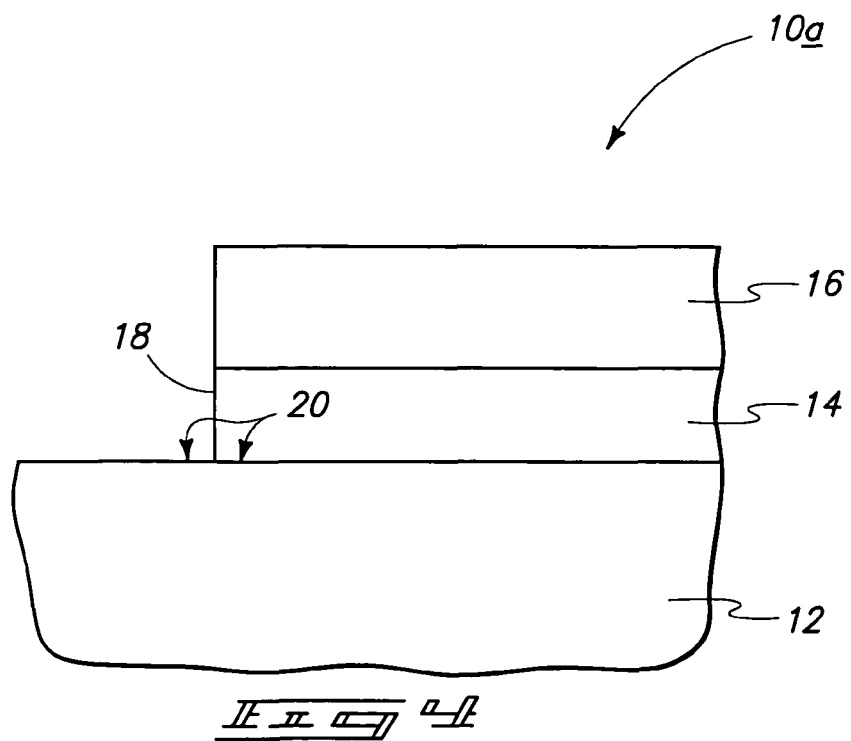

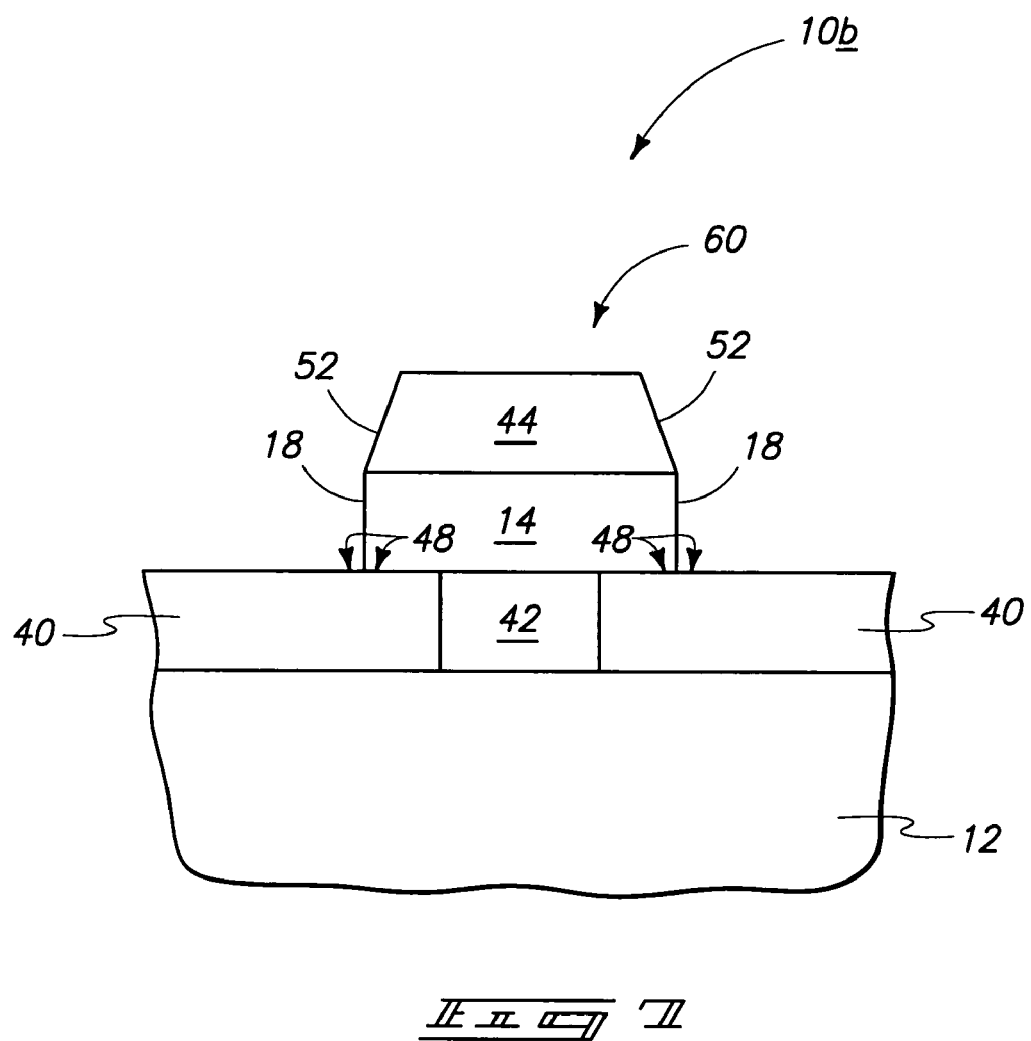

METHODS OF FORMING VARIABLE RESISTANCE MEMORY CELLS, AND METHODS OF ETCHING GERMANIUM, ANTIMONY, AND TELLURIUM-COMPRISING MATERIALS

TECHNICAL FIELD

This invention relates to methods of forming variable resistance memory cells, and to methods of etching materials comprising germanium, antimony, and tellurium.

BACKGROUND OF THE INVENTION

Semiconductor fabrication continues to strive to make individual electronic components smaller and smaller, resulting in ever denser integrated circuitry. One type of integrated circuitry comprises memory circuitry where information is stored in the form of binary data. Memory circuitry can be characterized by whether the data is volatile or non-volatile. Generally, volatile memory circuitry loses stored data when power is interrupted, while non-volatile memory circuitry retains stored data even during power interruption.

Some non-volatile memory devices utilize a material whose resistance can be controllably modified into two or more states of different resistance, thus enabling the devices to comprise settable memory. Exemplary particular types of memory devices which utilize such resistance variable material are programmable conductive random access memory and phase change random access memory. Phase change random access memory comprises a fast ion conductor or resistance variable material, typically a chalcogenide material having metal ions therein, which is disposed between two conductive electrodes. By way of example only, such are disclosed in U.S. Pat. Nos. 5,761,115; 5,896,312; 5,914,893 and 6,084,796 to Kozicki et al. Resistance variable materials are capable of assuming high resistance "off" and low resistance "on" states in response to a stimulus for a binary memory, and multiple generally stable states in response to a stimulus for a higher order memory. The resultant memory element is non-volatile in that it will maintain the integrity of the information stored by the memory cell without the need for periodic refresh signals, and the data integrity of the information stored by these memory cells is not lost when power is removed from the device.

As new variable resistance chalcogenide materials for memory devices are developed, new techniques need to be developed to be able to pattern such materials into desired shapes and configurations for memory cells.

While the invention was motivated in addressing the above identified issues, it is in no way so limited. The invention is only limited by the accompanying claims as literally worded, without interpretative or other limiting reference to the specification, and in accordance with the doctrine of equivalents.

BRIEF DESCRIPTION OF THE DRAWINGS

Preferred embodiments of the invention are described below with reference to the following accompanying drawings.

FIG. 3 is a diagrammatic section of another substrate fragment in process in accordance with an aspect of the invention.

FIG. 4 is a view of the FIG. 3 substrate fragment at a processing step subsequent to that shown by FIG. 3.

FIG. 7 is a view of the FIG. 6 substrate fragment at a processing step subsequent to that shown by FIG. 6.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Aspects of the invention encompass methods of forming a memory cell which include plasma etching of a variable resistance chalcogenide material comprising germanium, antimony, and tellurium. Aspects of the invention also encompass methods of etching a material comprising germanium, antimony, and tellurium independent of the purpose or construction for which such material is fabricated.

Figure 1:
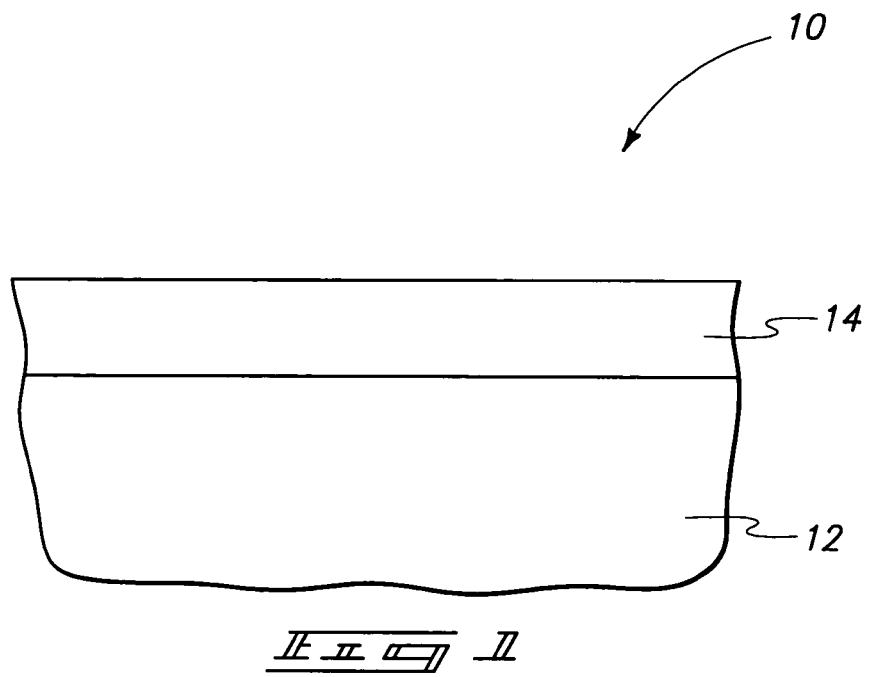
FIG. 1 is a diagrammatic section of a substrate fragment in process in accordance with an aspect of the invention.

A first exemplary implementation is described with reference to FIGS. 1 and 2. FIG. 1 depicts a substrate fragment indicated generally with reference numeral 10. In one preferred implementation, such comprises a semiconductor substrate 12 having a material 14 comprising germanium, antimony, and tellurium received thereover. Substrate 12 might comprise a semiconductor or other substrate. If a semiconductor substrate, such might comprise doped and/or undoped semiconductive materials in combination with one or more other materials, layers, and/or regions. Such might comprise semiconductor-on-insulator substrates and/or other substrates. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above Material 14 might comprise, consist essentially of, or consist of germanium, antimony, and tellurium in any mixture or stoichiometry. A typical and exemplary preferred material is $Ge_2Sb_2Te_5$.

Figure 2:
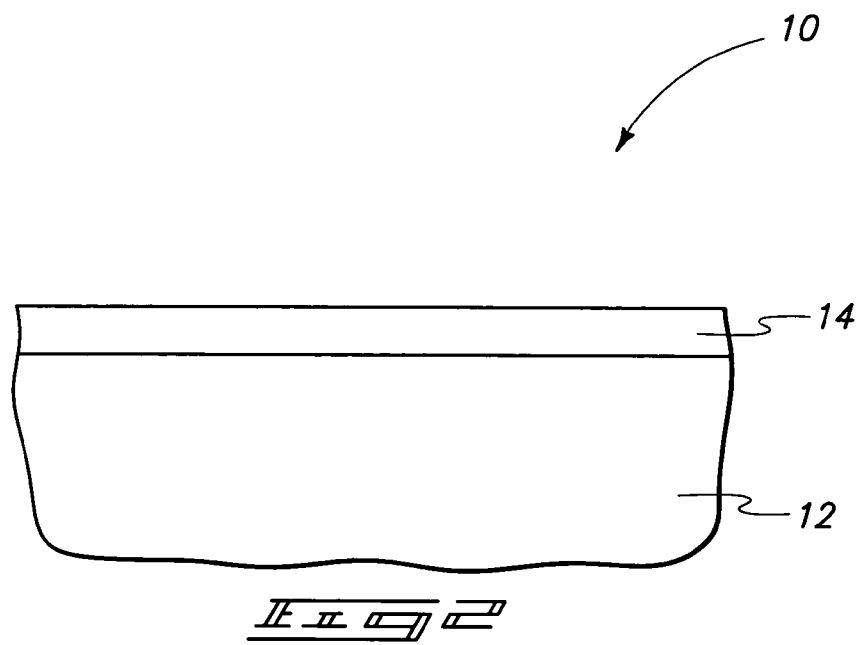
FIG. 2 is a view of the FIG. 1 substrate fragment at a processing step subsequent to that shown by FIG. 1.

Referring to FIG. 2, germanium, antimony, and tellurium-comprising material 14 has been exposed to a plasma-enhanced etching chemistry comprising $Cl_2$ and $CH_2F_2$ effective to etch such material. In the depicted exemplary FIG. 2 embodiment, only some of material 14 has been etched. Of course alternately, all of such material might be etched from over substrate 12 in the depicted exemplary FIG. 2 embodiment, and regardless of whether such plasma-enhanced etching chemistry is substantially selective to remove material 14 relative to material 12, or whether material 12 would be appreciably etched after the removing of material 14. In one preferred implementation, the exposing is to a plasma-enhanced etching chemistry consisting essentially of $Cl_2$ and $CH_2F_2$ as the only chemically active etching components in the etching chemistry. Regardless, in one preferred implementation, the exposing is to a plasma-enhanced etching chemistry comprising a molar ratio of from 1.5:1 to 1:2 of $Cl_2$ to $CH_2F_2$, more preferably from 0.8:1 to 1:1.2, even more preferably from 0.9:1 to 1:1.1, even more preferably from 0.95:1 to 1:1.15, and most preferably at a molar ratio of 1:1.

In one preferred implementation, the exposing is to a plasma-enhanced etching chemistry comprising inert gas, and in one implementation to such a chemistry consisting essentially of $Cl_2$, $CH_2F_2$, and inert gas. By way of example only, exemplary inert gases include $N_2$ and noble gases. A single inert gas might be used, or more than one inert gas might be used. Regardless, the quantity of inert gas in the plasma-enhanced etching chemistry might exceed that of either of the $Cl_2$ or $CH_2F_2$ or be less than that of either of the $Cl_2$ or $CH_2F_2$. Regardless, when used, the quantity of inert gas in the plasma-enhanced etching chemistry might exceed that of a sum of the $Cl_2$ and $CH_2F_2$ or be less than that of a sum of the $Cl_2$ and $CH_2F_2$. In one implementation, the etching occurs within a chamber within which plasma is generated. Yet, the invention also contemplates remote plasma etching whereby plasma is generated in one or more etching gases, or mixtures of etching gases, and then fed from a chamber within which plasma is generated to a chamber wherein a substrate is received for plasma-enhanced etching therein, and wherein plasma is not likely generated within the actual deposition chamber. When plasma is generated within the chamber, exemplary reactors include, by way of example only, inductively-coupled reactors and capacitively-coupled reactors. Regardless, a preferred exemplary temperature range for the etching is from 10° C. to 80° C., and a preferred pressure range is from 1 mTorr to 80 mTorr. In an inductively-coupled reactor, an exemplary preferred top electrode power is from 300 Watts to 1200 Watts, and a bottom electrode power of from 100 Watts to 800 Watts.

The invention was reduced-to-practice in an Applied Materials DPS Poly Etch system, which is an inductively-coupled reactor. Gas flow to the reactor was 20 sccm $Cl_2$, 20 sccm $CH_2F_2$, and 100 sccm of Ar. Substrate temperature was maintained at 25° C., while chamber pressure was kept at 10 mTorr. Such produced an etch rate of a layer comprising $Ge_2Sb_2Te_5$ of about 1,400 Angstroms per minute.

The invention was motivated in being able to etch substantially vertical/orthogonal sidewalls of a germanium, antimony and tellurium-comprising material or layer, for example as might be utilized in the fabrication of a memory cell that utilizes resistance variable material. By way of example only, additional preferred implementations of etching material comprising germanium, antimony, and tellurium are described with reference to FIGS. 3 and 4 in combination. Like numerals from the first-described embodiment are utilized where appropriate, with differences being indicated with the suffix "a" or with different numerals. FIG. 3 depicts a substrate fragment 10a comprising a suitable substrate 12 having a germanium, antimony, and tellurium-comprising material 14 received thereover. A mask 16 has been formed over material 14, and "on" such material, in the depicted preferred embodiment. In the context of this document, "on" or "thereon" defines at least some direct physical contacting relationship between the stated materials. Mask 16 might comprise one or more different materials and/or regions, and regardless might be entirely sacrificial or some or essentially all of depicted mask 16 might remain as part of the finished substrate construction. By way of example, one exemplary material for mask 16 includes photoresist, including multi-layer resist processing which might include one or more hardmasking layers. Further as identified above, mask 16 might comprise multiple layers and/or materials, including one or more conductive layers which might remain a part of the finished substrate construction.

Referring to FIG. 4, substrate 12/14/16 has been exposed to a plasma-enhanced etching chemistry comprising $Cl_2$ and $CH_2F_2$ effective to etch at least germanium, antimony, and tellurium-comprising material 14, as shown. Such is depicted as forming a substantially straight sidewall 18 (substantially straight when viewed in a vertical or orthogonal section view cut as shown) of germanium, antimony, and tellurium-comprising material 14. For purposes of the continuing discussion, substrate fragment 10a can be considered as comprising some substrate surface portion 20 over which germanium, antimony, and tellurium-comprising material 14 is received that is proximate depicted sidewall 18. Preferably, the exposing to a plasma-enhanced etching chemistry comprising $Cl_2$ and $CH_2F_2$ forms substantially straight sidewall 18 of material 14 which is at an angle that is within 5° of orthogonal to substrate surface 20 on which germanium, antimony, and tellurium-comprising material 14 is received. More preferably, the exposing to such etching chemistry forms sidewall 18 at an angle that is within 2° of orthogonal to outer surface 20, and even more preferably at an angle within 1°, and even more preferably is at essentially exactly orthogonal to such surface as is shown in FIG. 4. Processing and materials are preferably otherwise as described above in connection with the first-described embodiment.

Figure 5:
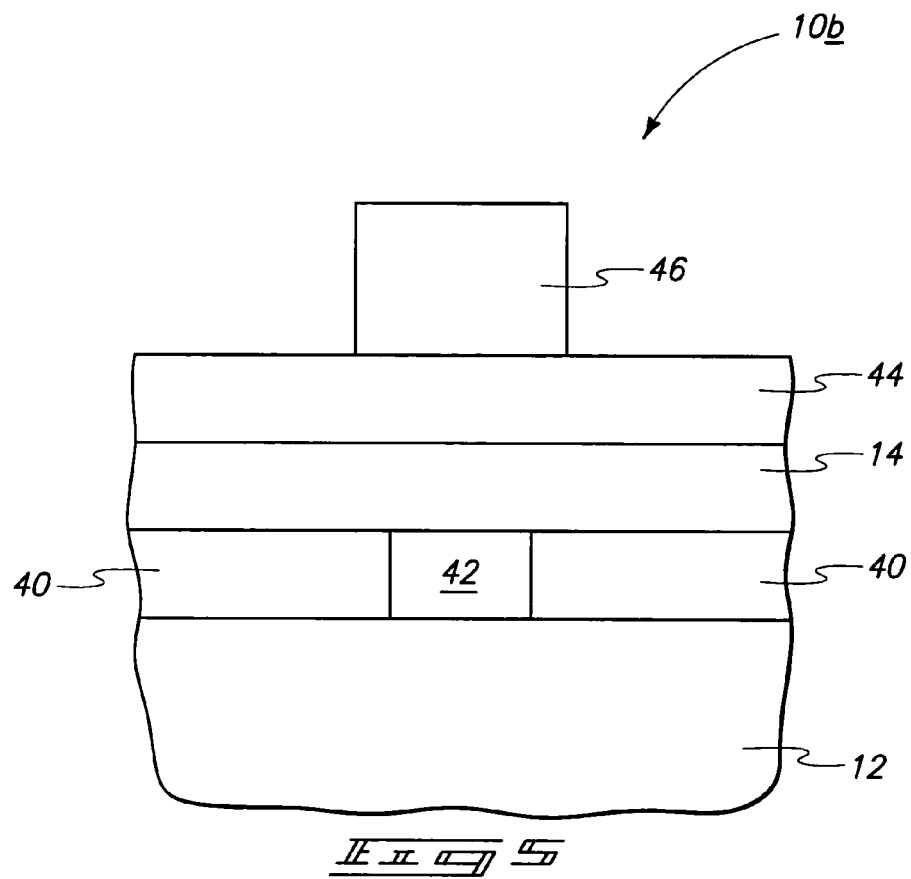
FIG. 5 is a diagrammatic section of still another substrate fragment in process in accordance with an aspect of the invention.

Exemplary implementations, by way of example only, of incorporating aspects of the above description in methods of forming a variable resistance memory cell are described with reference to FIGS. 5-7. Like numerals from the above described embodiment have been utilized where appropriate, with differences being indicated with the suffix "b" or with different numerals. Referring initially to FIG. 5, and by way of example only, an insulative material layer 40 is received over substrate 12, and includes a conductive region 42 formed therein. Such might comprise a conductive plug and/or line formed within an opening of material 40, by way of example. Further by way of example only, exemplary materials 40 include silicon nitride and/or doped or undoped silicon dioxide. An exemplary conductive material 42 includes conductively doped semiconductive materials, elemental metals, alloys of elemental metals, and/or conductive metal compounds. Material 42 would connect with some other region or conductive device component, and in one exemplary embodiment comprises a conductive inner electrode material which has been formed over a substrate 12. One specific example includes TiN.

A variable resistance chalcogenide material 14 has been formed over substrate 12, and comprises germanium, antimony, and tellurium which has been formed over conductive inner electrode material 42, and preferably thereon as shown. A conductive outer electrode material 44 has been formed over chalcogenide material 14. Such might be of the same or different materials as conductive inner electrode material 42, and of course and regardless, materials 42 and 44 might individually comprise one or more different conductive materials. By way of example only, one preferred material for conductive outer electrode material 44 includes TiN, and whether material/layer 44 comprises, consists essentially of, or consists of TiN.

A patterned masking material 46 is formed over conductive outer electrode material 44, and typically/preferably thereon as shown. An exemplary preferred material 46 comprises photoresist.

Figure 6:
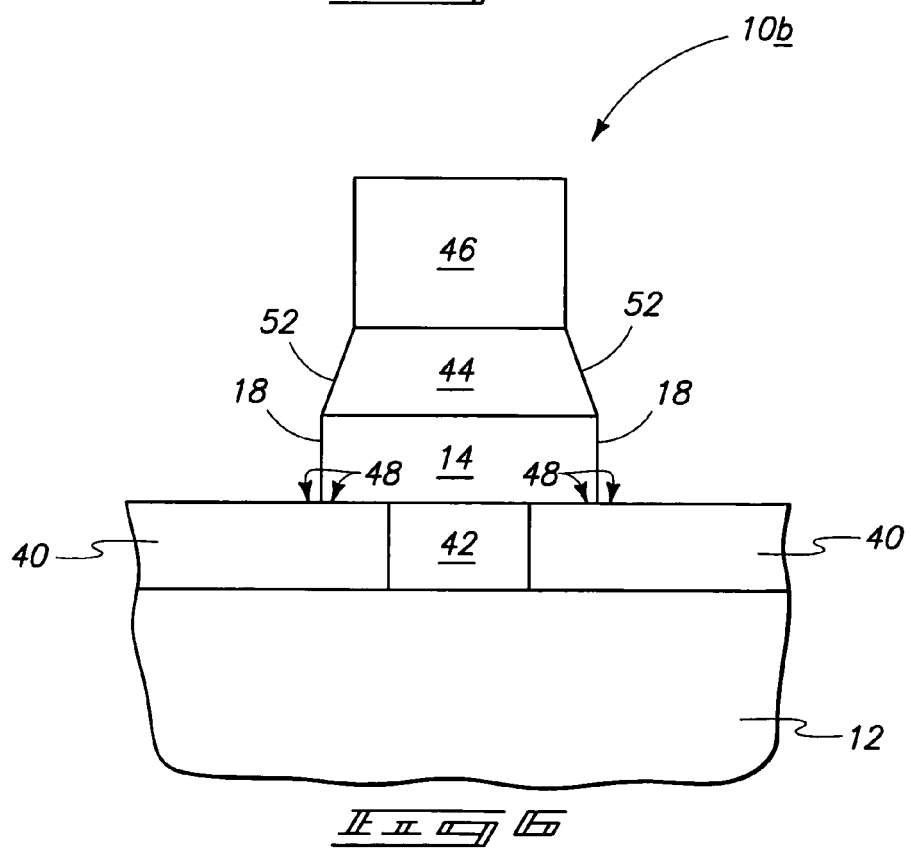
FIG. 6 is a view of the FIG. 5 substrate fragment at a processing step subsequent to that shown by FIG. 5.

Referring to FIG. 6, and using patterned mask 46 as a mask, exemplary material 44 and germanium, antimony, and tellurium-comprising material 14 have been plasma etched using a chemistry comprising $Cl_2$ and $CH_2F_2$. Exemplary preferred parameters, materials and techniques for such plasma etching are as described above in the first-described embodiments. Using the above exemplary reduction-to-practice example and where material 44 consisted essentially of TiN, etch rate of the TiN was at 600 Angstroms per minute.

In the depicted exemplary embodiment, such plasma etching has been effective to form substantially straight sidewalls 18 of material 14. For purposes of the continuing discussion, substrate 10b can be considered as comprising respective substrate surfaces 48 on which germanium, antimony, and tellurium-comprising material 14 is received. Preferably, substantially straight sidewalls 18 are at an angle within 5° of orthogonal to substrate surface 48 proximate sidewalls 18. More preferably, such angles are the same as described above in connection with the FIGS. 3 and 4 embodiment of substantially straight sidewall 18 relative to surface 20.

FIG. 6 depicts the subject etching as forming substantially straight second sidewalls 52 of an exemplary TiN-comprising outer electrode material 44 which are angled differently relative to outer surface 48 as compared to the angling of exemplary first sidewalls 18 relative to surface 48. In one implementation, angles of sidewalls 52 are not orthogonal to surfaces 48, and are at least 5° away from orthogonal to such surfaces. In exemplary embodiments, second sidewalls 52 are angled at least 10° away from orthogonal to surfaces 48, and can be angled at least 20° from orthogonal to surfaces 48, with an exemplary angle of 20° being shown in FIG. 6. FIG. 6 also depicts some lateral dimension loss of mask 46 which might occur and did occur in the above reduction-to-practice example, but is of course not required.

Referring to FIG. 7, masking material 46 has been removed, leaving an exemplary variable resistance memory cell comprising a conductive inner electrode material 42, a variable resistance chalcogenide material 44 comprising germanium, antimony, and tellurium thereover, and a conductive outer electrode material 44.

An exemplary additional plasma etching chemistry which was utilized and did not result in the depicted profiles included chemistries in one instance having $NF_3$ as the only chemically active species, and in another implementation $CF_4$ as the only chemically active species. Accordingly, most preferably, the preferred plasma etching chemistry is void of detectable quantities of either of such gases, although aspects of the invention do not necessary preclude including one or both gases in combination with a plasma-enhanced etching chemistry comprising $Cl_2$ and $CH_2F_2$.

$CH_2F_2$ has been utilized in gate stacks including one or a combination of silicon dioxide, silicon nitride, conductively doped polysilicon, and metals. However, the chemistries disclosed herein are not understood to have ever been utilized or suggested for use in etching germanium, antimony, and tellurium-comprising materials.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a variable resistance memory cell, comprising:
   forming a conductive inner electrode material over a substrate;
   forming a variable resistance chalcogenide material comprising germanium, antimony, and tellurium over the conductive inner electrode material;
   forming a conductive outer electrode material over the chalcogenide material; and
   plasma etching the germanium, antimony, and tellurium-comprising material using a chemistry comprising $Cl_2$ and $CH_2F_2$.

2. The method of claim 1 wherein the plasma etching forms a substantially straight sidewall of the germanium, antimony, and tellurium-comprising material which is at an angle that is within 5° of orthogonal to a substrate surface proximate the sidewall on which the germanium, antimony, and tellurium-comprising material is received.

3. The method of claim 2 wherein the plasma etching forms the sidewall of the germanium, antimony, and tellurium-comprising material at an angle that is within 2° of orthogonal to said surface.

4. The method of claim 3 wherein the plasma etching forms the sidewall of the germanium, antimony, and tellurium-comprising material at an angle that is orthogonal to said surface.

5. The method of claim 1 comprising forming the variable resistance chalcogenide material to comprise $Ge_2Sb_2Te_5$.

6. The method of claim 1 wherein the etching occurs within a chamber, plasma being generated within said chamber.

7. The method of claim 1 wherein the etching occurs within a chamber, plasma being generated remote from said chamber.

8. A method of forming a variable resistance memory cell, comprising:
   forming a conductive inner electrode material over a substrate;
   forming a variable resistance chalcogenide material comprising germanium, antimony, and tellurium over the conductive inner electrode material;
   forming a conductive outer electrode material comprising TiN on the chalcogenide material;
   forming patterned masking material over the TiN-comprising material; and
   using the patterned masking material, plasma etching the TiN-comprising material and the germanium, antimony, and tellurium-comprising material using a chemistry comprising $Cl_2$ and $CH_2F_2$.

9. The method of claim 8 comprising forming the patterned masking material to comprise photoresist.

10. The method of claim 8 comprising forming the conductive outer electrode material to consist essentially of TiN.

11. The method of claim 8 comprising conducting said plasma etching effective to form a substantially straight sidewall of the germanium, antimony, and tellurium-comprising material which is at an angle that is within 5° of orthogonal to a substrate surface proximate the sidewall on which the germanium, antimony, and tellurium-comprising material is received.

12. A method of forming a variable resistance memory cell, comprising:
   forming a conductive inner electrode material over a substrate;
   forming a variable resistance chalcogenide material comprising germanium, antimony, and tellurium over the conductive inner electrode material;
   forming a conductive outer electrode material comprising TiN on the chalcogenide material;
   forming patterned masking material over the TiN-comprising material;

using the patterned masking material, plasma etching the TiN-comprising material and the germanium, antimony, and tellurium-comprising material using a chemistry comprising $Cl_2$ and $CH_2F_2$;

conducting said plasma etching effective to form a substantially straight first sidewall of the germanium, antimony, and tellurium-comprising material which is at a first angle that is within 5° of orthogonal to a substrate surface proximate the first sidewall on which the germanium, antimony, and tellurium-comprising material is received; and conducting said plasma etching effective to form a substantially straight second sidewall of the TiN-comprising material which is at a second angle to said substrate surface that is different from said first angle.

13. The method of claim 12 wherein the second angle is not orthogonal to said surface, and is at least 5° away from orthogonal to said surface.

14. The method of claim 13 wherein the second angle is not orthogonal to said surface, and is at least 10° away from orthogonal to said surface.

15. The method of claim 14 wherein the second angle is not orthogonal to said surface, and is at least 15° away from orthogonal to said surface.

16. The method of claim 13 wherein the plasma etching is with a plasma etching chemistry which is void of detectable $NF_3$ and $CF_4$.

17. The method of claim 13 wherein the plasma etching is with a plasma etching chemistry which comprises at least one $NF_3$ or $CF_4$.

18. A method of etching a material comprising germanium, antimony, and tellurium comprising exposing said material to a plasma-enhanced etching chemistry comprising $Cl_2$ and $CH_2F_2$.

19. The method of claim 18 wherein the exposing is to a plasma-enhanced etching chemistry consisting essentially of $Cl_2$ and $CH_2F_2$ as chemically active etching components.

20. The method of claim 18 wherein the exposing is to a plasma-enhanced etching chemistry comprising a molar ratio of from 1.5:1 to 1:2 of $Cl_2$ to $CH_2F_2$.

21. The method of claim 18 wherein the exposing is to a plasma-enhanced etching chemistry comprising a molar ratio of from 0.8:1 to 1:1.2 of $Cl_2$ to $CH_2F_2$.

22. The method of claim 18 wherein the exposing is to a plasma-enhanced etching chemistry comprising inert gas.

23. The method of claim 18 wherein the exposing is at temperature of from 10° C. to 80° C., and at a pressure of from 1 mTorr to 80 mTorr.

24. The method of claim 18 wherein the exposing is within a chamber of an inductively coupled reactor, with plasma being generated within the chamber.

25. The method of claim 18 wherein the exposing is within a chamber of a capacitively coupled reactor, with plasma being generated within the chamber.

26. The method of claim 18 wherein the exposing is within a chamber, with plasma being generated remote from said chamber.

27. A method of etching a material comprising germanium, antimony, and tellurium comprising exposing said material to a plasma-enhanced etching chemistry consisting essentially of $Cl_2$, $CH_2F_2$, and inert gas at a molar ratio of from 0.8:1 to 1:1.2 $Cl_2$ to $CH_2F_2$ at temperature of from 10° C. to 80° C. and at a pressure of from 1 mTorr to 80 mTorr.

* * * * *

UNITED STATES PATENT AND TRADEMARK OFFICE
CERTIFICATE OF CORRECTION

PATENT NO. : 7,825,033 B2
APPLICATION NO. : 11/450020
DATED : November 2, 2010
INVENTOR(S) : Allen It is certified that error appears in the above-identified patent and that said Letters Patent is hereby corrected as shown below:

On the Title Page, Item (56), under "Other Publications", line 1, delete "High-Censity" and insert -- High-Density --, therefor.

Signed and Sealed this
Eleventh Day of January, 2011

David J. Kappos
*Director of the United States Patent and Trademark Office*